United States Patent
Lee

(10) Patent No.: US 11,522,160 B2
(45) Date of Patent: Dec. 6, 2022

(54) OPTICAL LAYER HAVING REFRACTIVE LAYER COVERING ORGANIC LAYER AND DISPLAY DEVICE INCLUDING THE SAME

(71) Applicant: Samsung Display Co., Ltd., Yongin-si (KR)

(72) Inventor: Eonjoo Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 281 days.

(21) Appl. No.: 16/876,273

(22) Filed: May 18, 2020

(65) Prior Publication Data
US 2021/0175468 A1    Jun. 10, 2021

(30) Foreign Application Priority Data

Dec. 4, 2019  (KR) .................. 10-2019-0160000

(51) Int. Cl.
*H01L 51/52* (2006.01)
*H01L 27/32* (2006.01)

(52) U.S. Cl.
CPC ........ *H01L 51/5253* (2013.01); *H01L 27/322* (2013.01); *H01L 27/323* (2013.01); *H01L 27/3246* (2013.01); *H01L 51/5271* (2013.01); *H01L 51/5275* (2013.01); *H01L 51/5284* (2013.01)

(58) Field of Classification Search
CPC combination set(s) only.
See application file for complete search history.

(56) References Cited

U.S. PATENT DOCUMENTS

| | | | |
|---|---|---|---|
| 10,409,411 B2 | 9/2019 | Heo et al. | |
| 2015/0048333 A1 | 2/2015 | Choi et al. | |
| 2017/0090634 A1* | 3/2017 | Yang | G06F 3/0445 |
| 2018/0013100 A1 | 1/2018 | Yim et al. | |
| 2019/0074339 A1* | 3/2019 | Ma | H01L 27/323 |
| 2019/0146622 A1* | 5/2019 | Kang | G06F 3/0412 |
| | | | 345/173 |
| 2020/0144550 A1* | 5/2020 | Lee | H01L 51/5281 |

FOREIGN PATENT DOCUMENTS

| | | |
|---|---|---|
| JP | 2013-191464 A | 9/2013 |
| KR | 1020150019325 A | 2/2015 |
| KR | 1020150136855 A | 12/2015 |
| KR | 1020160054703 A | 5/2016 |
| KR | 1020180005772 A | 1/2018 |
| KR | 1020180074980 A | 7/2018 |

* cited by examiner

*Primary Examiner* — Nduka E Ojeh
(74) *Attorney, Agent, or Firm* — Cantor Colburn LLP

(57) ABSTRACT

A display device includes: a display area; a display element which emits light and includes a pixel electrode, an opposite electrode, and a light emission layer between the pixel electrode and the opposite electrode; an encapsulation layer covering the display element; sensing electrodes disposed on the encapsulation layer; and a light-shielding layer disposed on each of the sensing electrodes to correspond to each of the sensing electrodes. The encapsulation layer includes: a first organic layer having a refractive index, a first opening defined in the first organic layer and corresponding to the light emission layer of the display element, and a first refractive layer covering the first organic layer.

19 Claims, 10 Drawing Sheets

OPTICAL LAYER HAVING REFRACTIVE LAYER COVERING ORGANIC LAYER AND DISPLAY DEVICE INCLUDING THE SAME

This application claims priority to Korean Patent Application No. 10-2019-0160000, filed on Dec. 4, 2019, and all the benefits accruing therefrom under 35 U.S.C. § 119, the disclosure of which is incorporated herein in its entirety by reference.

BACKGROUND

1. Field

One or more embodiments relate to a display device.

2. Description of Related Art

Use of display devices has become more diversified. As the thickness and weight of display devices have been reduced, a usable range of the display devices has been gradually extended. Since display devices are used in various fields, the demand for display devices providing high-quality images is increasing.

SUMMARY

A display device may include pixels which emit colored light to output images to outside the display device. The display device may include layers to protect main elements of the pixels or to add a functionality to the display device. Accordingly, the efficiency of light emitted from each pixel may be deteriorated owing to these layers.

One or more embodiments provide a display device with improved light emission efficiency.

Additional features will be set forth in part in the description which follows and, in part, will be apparent from the description, or may be learned by practice of the presented embodiments of the disclosure.

According to one or more embodiments, a display device includes a display area; a display element which emits light and includes a pixel electrode, an opposite electrode, and a light emission layer between the pixel electrode and the opposite electrode; an encapsulation layer covering the display element; sensing electrodes disposed on the encapsulation layer; and a light-shielding layer disposed on each of the sensing electrodes to correspond to each of the sensing electrodes. The encapsulation layer includes: a first organic layer having a refractive index, a first opening defined in the first organic layer and corresponding to the light emission layer of the display element, and a first refractive layer covering the first organic layer.

The display element may emit the light in a light-emitting direction, and within the encapsulation layer, the first refractive layer may be further from the display element than the first organic layer, along the light-emitting direction.

The encapsulation layer may further include a first inorganic encapsulation layer and a second inorganic encapsulation layer, and the first organic layer and the first refractive layer may be between the first inorganic encapsulation layer and the second inorganic encapsulation layer.

The first organic layer may include a side surface at the first opening which is inclined with respect to an upper surface of the first inorganic encapsulation layer.

The first refractive layer may include an organic encapsulation layer which fills the first opening defined in the first organic layer.

The display device may further include, on the light-shielding layer, a color filter corresponding to a wavelength band of the light emitted from the light emission layer.

The first refractive layer may include a color filter corresponding to a wavelength band of the light emitted from the light emission layer.

The light-shielding layer may include a black pigment.

The display device may further include a pixel-defining layer covering edges of the pixel electrode, and a second opening defined in the pixel-defining layer and corresponding to the pixel electrode. A width of the first opening may be greater than or equal to a width of the second opening.

The first opening may penetrate through a lower surface and an upper surface of the first organic layer.

The first refractive layer may have a refractive index greater than the refractive index of the first organic layer.

A refractive index of the first refractive layer may be about 1.7 to about 1.9.

The display device may further include a second organic layer arranged above or below the sensing electrodes, a third opening defined in the second organic layer and corresponding to the light emission layer, and a second refractive layer covering the light-shielding layer and the second organic layer.

The second refractive layer may be further from the display element than the second organic layer.

The second refractive layer may include a color filter.

A width of the third opening may be greater than or equal to the width of the first opening.

The second organic layer may include photoresist.

The second refractive layer may have a refractive index greater than the refractive index of the second organic layer.

According to one or more embodiments, a display device includes a display area in which an image is displayed; a display element which is in the display area and emits light, the display element including a pixel electrode, an opposite electrode, and a light emission layer between the pixel electrode and the opposite electrode; an encapsulation layer covering the display element; an input sensing layer facing the display element with the encapsulation layer therebetween; and an optical layer which between the display element and the input sensing layer. The rein the optical layer which between the display element and the input sensing layer includes an organic layer having a refractive index, a concave recess which is open in a direction toward the input sensing layer and corresponds to the light emission layer of the display element; and a refractive layer covering the organic layer.

The first refractive layer may include a color filter.

BRIEF DESCRIPTION OF THE DRAWINGS

The above and other features, and advantages embodiments of the disclosure will be more apparent from the following description taken in conjunction with the accompanying drawings, in which.

DETAILED DESCRIPTION

Figure 1:
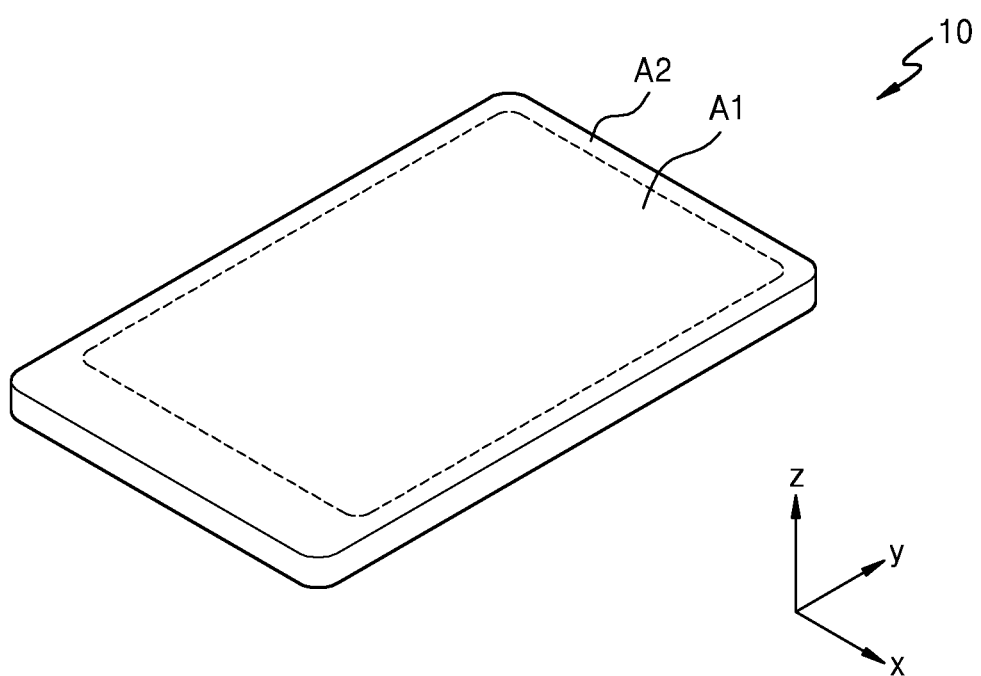
FIG. 1 is a schematic perspective view of an embodiment of a display device.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present disclosure will be described in detail by explaining embodiments of the disclosure with reference to the attached drawings. Like reference numerals in the drawings denote like elements, and redundant explanations thereof are omitted.

In the following description, while such terms as "first," "second," etc. may be used to describe various elements, such elements must not be limited to the above terms. The above terms are used only to distinguish one element from another.

In the following description, an expression used in the singular form encompasses the expression of the plural form, unless it has a clearly different meaning in the context. As used herein, the singular forms "a," "an," and "the" are intended to include the plural forms, including "at least one," unless the content clearly indicates otherwise.

In the following description, it will be understood that the terms such as "including," "having," and "comprising" are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

In the following description, it will be understood that when a component, such as a layer, a film, an area, or a plate, is referred to as being related to another element such as being "on" another component, the component can be directly on the other component or intervening components may be present thereon. In contrast, when a component, such as a layer, a film, an area, or a plate, is referred to as being related to another element such as being "directly on" another component, no other component or intervening components is present.

Sizes of components in the drawings may be exaggerated for convenience of explanation. In other words, since sizes and thicknesses of components in the drawings are arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

"At least one" is not to be construed as limiting "a" or "an." "or" means "and/or." The expression "A and/or B" indicates only A, only B, or both A and B. Also, the expression "at least one of A and B" indicates only A, only B, or both A and B. Further, the expression "at least one of A, B, or C" indicates only A, only B, only C, at least one of A and B, at least one of A and C, at least one of B and C, or all of A, B, and C.

It will be understood that when a layer, area, or element is referred to as being related to another element such as being "connected" to another layer, area, or element, it may be "directly connected" to the other layer, area, or element and/or may be "indirectly connected" to the other layer, area, or element with other layer, area, or element therebetween. For example, it will be understood that when a layer, area, or element is referred to as being "electrically connected" to another layer, area, or element, it may be "directly electrically connected" to the other layer, area, or element and/or may be "indirectly electrically connected" to other layer, area, or element with other layer, area, or element therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the following examples, the x-axis, the y-axis, and the z-axis are not limited to three axes of the rectangular coordinate system, and may be interpreted in a broader sense. For example, the x-axis (or x-direction), the y-axis (or y-direction), and the z-axis (or z-direction) may be perpendicular to one another, or may represent different directions that are not perpendicular to one another.

FIG. 1 is a schematic perspective view of an embodiment of a display device 10.

Referring to FIG. 1, the display device 10 may include a first area A1 and a second area A2. The first area A1 may be adjacent to the second area A2 and disposed further from an outer edge of the display device 10 than the second area A2. The display device 10 and components thereof may be disposed in a plane defined by a first direction and a second direction which cross each other. In FIG. 1, for example, the x-axis and the y-axis may variously represent the first direction and the second direction. The display device 10 and components thereof may have a thickness which is defined along a third direction crossing each of the first direction and the second direction. In FIG. 1, for example, the z-axis may represent the third direction.

The first area A1 may be defined as a planar area in which pixels P are arranged. The pixels P may generate light, emit light, etc. The display device 10 may provide an image or image information by using light emitted from a plurality of pixels P arranged in the first area A1. In an embodiment, for example, the first area A1 may be referred to as a display area. At the display area, light may be generated, light may be emitted, an image may be displayed, etc.

The second area A2 may be arranged to at least partially surround the first area A1 in a top plan view. The second area A2 may include a planar area in which a circuit is disposed. The circuit may be connected to one or more of the pixels P and may provide an electrical signal to the pixels P arranged in the first area A1. The circuit may drive or control the pixels P to generate light, emit light, display an image, etc. At the second area A2, light may not be generated, light may not be emitted, an image may not be displayed, etc., such as to define a non-display area.

Though FIG. 1 shows that the first area A1 has a substantially rectangular planar shape and is arranged toward one side (e.g., an upper right side) of the display device 10, the present disclosure is not limited thereto.

Hereinafter, though an organic light-emitting display device is described as an example of the display device 10, the display device 10 according to the embodiment is not limited thereto.

In another embodiment, the display device 10 may be an inorganic light-emitting display (or an inorganic electroluminescent ("EL") display) and a quantum dot light-emitting display.

In an embodiment, for example, a light emission layer 222 of a display element in the display device 10 may include an organic material, an inorganic material, quantum dots, an organic material and quantum dots, or inorganic material and quantum dots.

The display device 10 described above may be used in various electronic devices such as mobile phones, laptops, and smartwatches.

Figure 2:
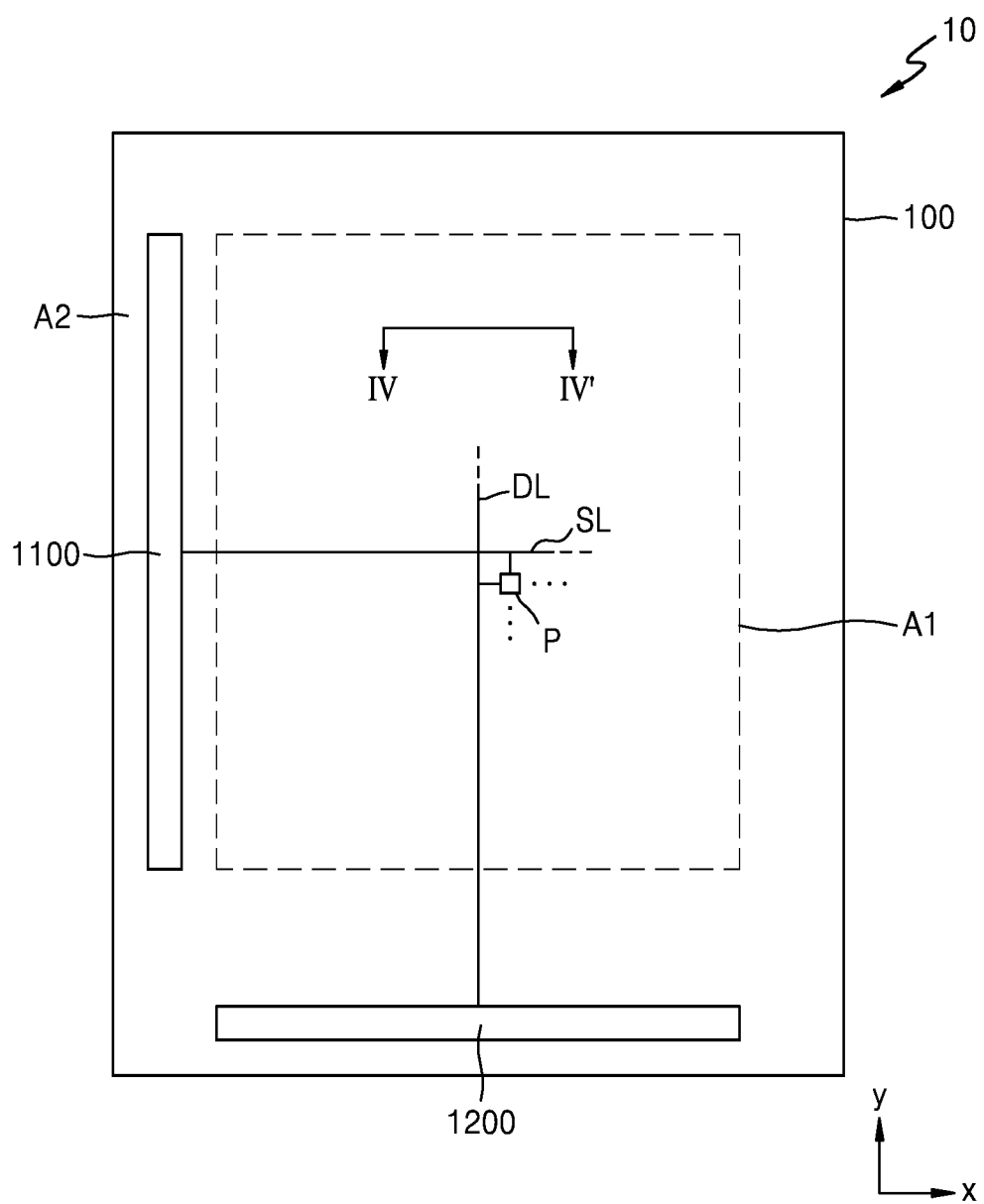
FIG. 2 is a schematic top plan view of an embodiment of a display device.

FIG. 2 is a schematic top plan view of an embodiment of the display device 10.

Referring to FIG. 2, the display device 10 may include a pixel P provided in plurality (e.g., a plurality of pixels P) arranged in the first area A1. The pixels P may be provided on a substrate 100. A shape or total planar area of the substrate 100 may correspond to a shape or total planar area of the display device 10, without being limited thereto.

The pixel P may include a display element which generates and/or emits light, and the display element may be electrically connected to a scan line SL and a data line DL. Referring to FIG. 2, the substrate 100 may include the first area A1 and the second area A2 described above. One or more layer or component of the display device 10 may include a first area A1 and a second area A2 corresponding to the first area A1 and the second area A2 described above.

A scan driving circuit 1100 which provides an electrical signal such as a scan signal to each pixel P through the scan line SL and a data driving circuit 1200 which provides an electrical signal such as a data signal to a display element in each pixel P through the data line DL, may be arranged in the second area A2. Though not shown in FIG. 2, first and second power supply wires which supply first and second power supply voltages may be arranged in the second area A2 and may be electrically connected to each of the pixels P.

Though FIG. 2 illustrates a structure in which the data driving circuit 1200 is arranged on the substrate 100, in another embodiment, the data driving circuit 1200 may be arranged on a flexible printed circuit board ("FPCB") which is an element separate from the substrate 100 and electrically connected thereto by a pad of the display device 10.

Figure 3:
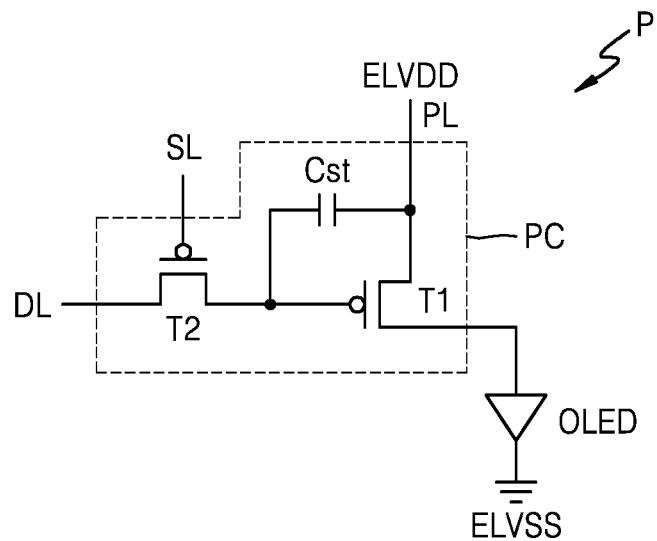
FIG. 3 illustrates an embodiment of a display element of a pixel of a display device and a pixel circuit connected thereto.

FIG. 3 illustrates an embodiment of a display element in a pixel P of the display device 10, and a pixel circuit PC which is connected to the display element.

Referring to FIG. 3, an organic light-emitting diode as a display element OLED illustrated as a display element may be connected to the pixel circuit PC. The pixel circuit PC may include a first thin-film transistor T1, a second thin-film transistor T2, and a storage capacitor Cst. The organic light-emitting diode as the display element OLED may generate and emit, for example, red, green, or blue light, or red, green, blue, or white light.

The second thin-film transistor T2, which is a switching thin-film transistor, may be connected to the scan line SL and the data line DL and may transmit an electrical signal such as a data voltage input from the data line DL, to the first thin-film transistor T1, according to an electrical signal such as a switching voltage input from the scan line SL. The storage capacitor Cst is connected to the second thin-film transistor T2 and a driving voltage line PL. The storage capacitor Cst may store a voltage corresponding to a difference between a voltage received from the second thin-film transistor T2 and a first power voltage ELVDD (as an electrical signal) supplied to the driving voltage line PL.

The first thin-film transistor T1, which is a driving thin-film transistor, may be connected to the driving voltage line PL and the storage capacitor Cst. The first thin-film transistor T1 may control a driving electrical current flowing from the driving voltage line PL to the organic light-emitting diode as the display element OLED, in accordance with a value of the voltage stored in the storage capacitor Cst. The organic light-emitting diode as the display element OLED may generate and/or emit light having a luminance according to the driving electrical current. An opposite electrode (e.g., a cathode) of the organic light-emitting diode as the display element OLED may receive a second power voltage ELVSS.

Though FIG. 3 illustrates that the pixel circuit PC includes two thin-film transistors and one storage capacitor Cst, in another embodiment, the number of thin-film transistors or the number of storage capacitors may be variously changed according to the design of the pixel circuit PC.

Figure 4:
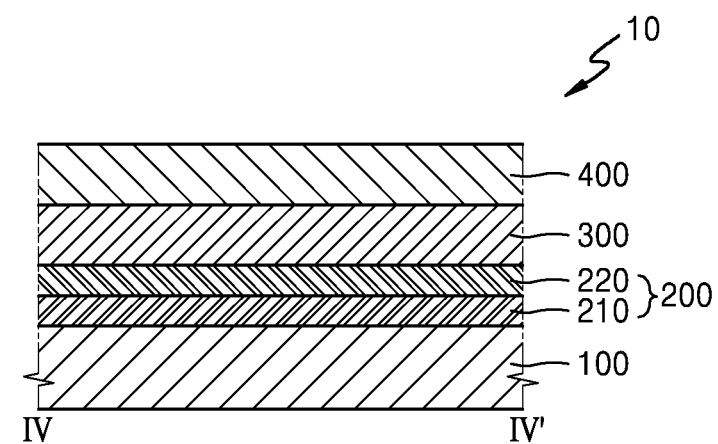
FIG. 4 is an enlarged cross-sectional view of an embodiment of a display device.

FIG. 4, which is an enlarged cross-sectional view of an embodiment of the display device 10 taken along line IV-IV' of FIG. 2.

Referring to FIG. 4, a display layer 200 may be arranged on the substrate 100. An encapsulation layer 300 covering the display layer 200 may be arranged on the display layer 200. In addition, a functional layer 400 may be arranged on the encapsulation layer 300. The functional layer 400 and/or the substrate 100 may define an outer surface of the display device 10 without being limited thereto.

The substrate 100 may include a polymer resin or a glass material. The substrate 100 including the polymer resin may be flexible, rollable, or bendable. The display layer 200 may include a display element layer 220 and a pixel circuit layer 210. The display element layer 220 includes a plurality of display elements and the pixel circuit layer 210 includes the pixel circuit PC provided in plurality (e.g., pixel circuits) which are connected to the display elements.

Each of the display elements in the display element layer 220 may define or correspond to a pixel P.

The pixel circuit layer 210 may include a plurality of transistors and a plurality of storage capacitors.

The encapsulation layer 300 is arranged on the display layer 200. The encapsulation layer 300 faces the substrate 100 with the display layer 200 therebetween. The encapsulation layer 300 may reduce or effectively prevent to the display elements by external foreign substances such as moisture. The encapsulation layer 300 may include at least one inorganic encapsulation layer and an optical layer. In an embodiment, for example, the encapsulation layer 300 may include a first inorganic encapsulation layer 310, a second inorganic encapsulation layer 330, and an optical layer therebetween.

The functional layer 400 may be arranged on the encapsulation layer 300. The functional layer 400 may face the display layer 200 with the encapsulation layer 300 therebetween. The functional layer 400 may include an input sensing layer which senses an input like a touch input. Insulating layers included in the functional layer 400 may include a structure for improving light emission efficiency of light emitted from the display elements. The functional layer 400 may include sensing electrodes to sense the input such as a touch input.

Figure 5:
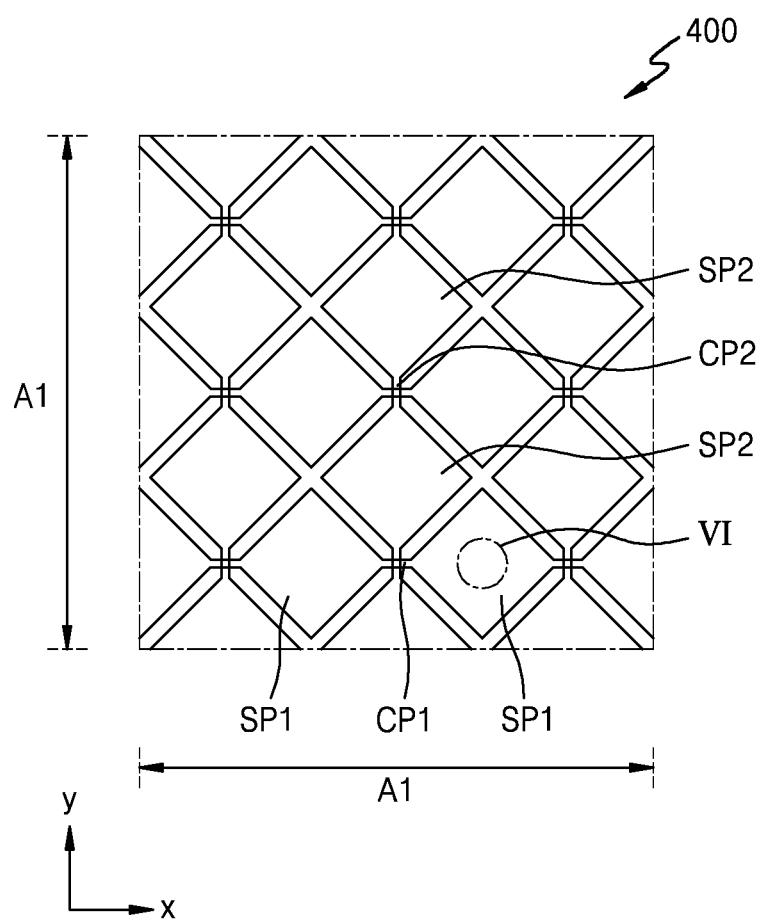
FIG. 5 is an enlarged top plan view of an embodiment of a functional layer.
Figure 6A:
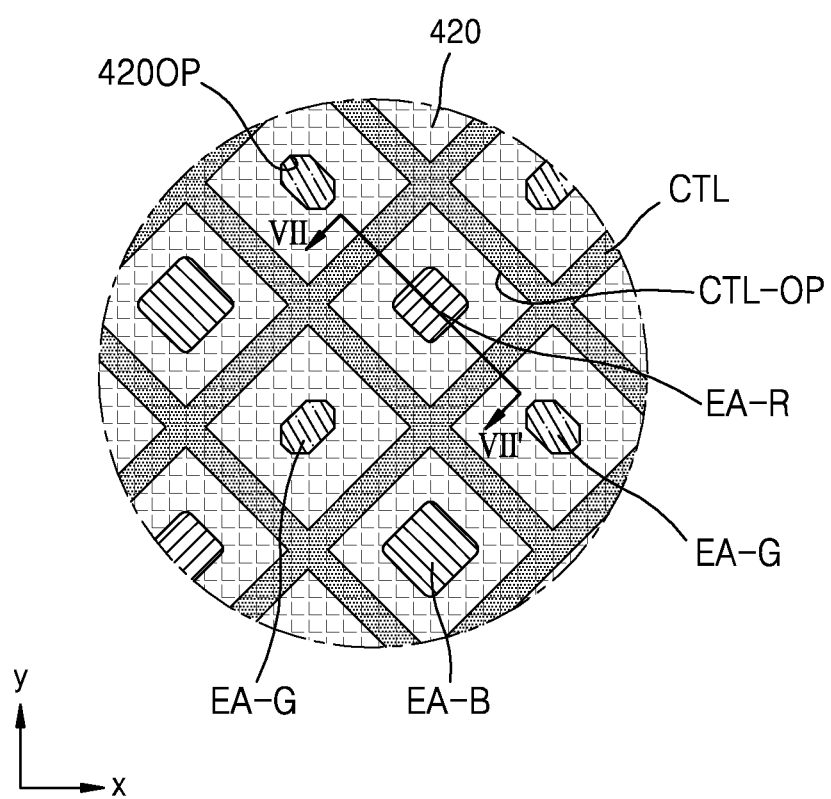
FIGS. 6A and 6B are enlarged top plan views of region VI of FIG. 5.
Figure 6B:
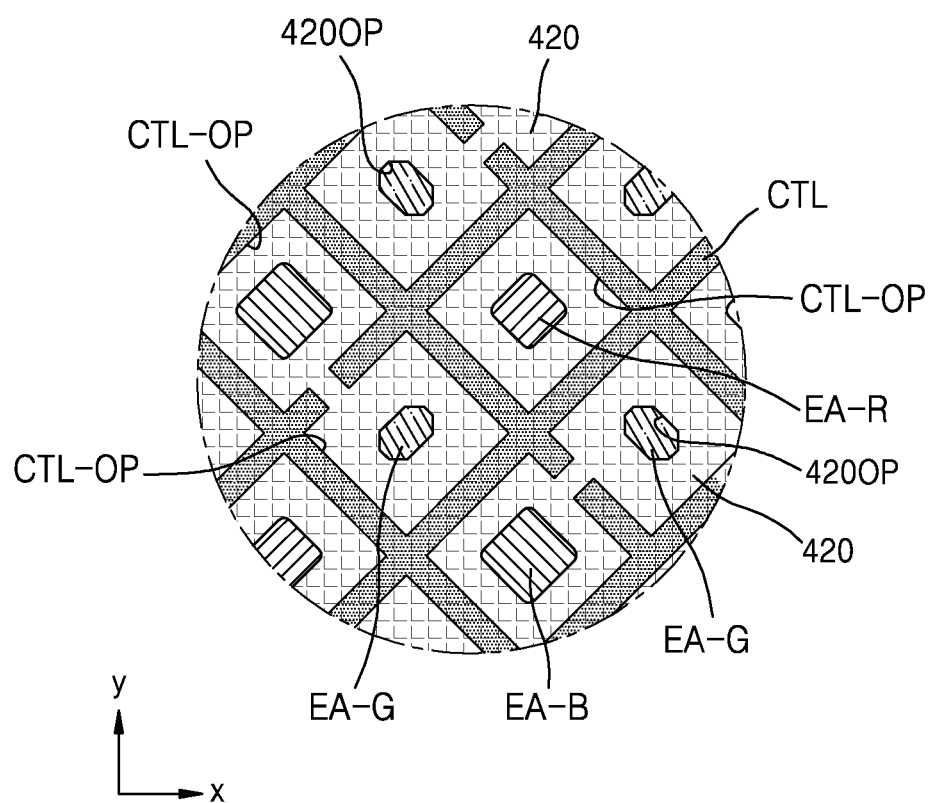

FIG. 5 is an enlarged top plan view of an embodiment of the functional layer 400. FIGS. 6A and 6B are enlarged plan views of region VI of FIG. 5 according to an embodiment.

Referring to FIG. 5, the functional layer 400 may include a first sensing electrode SP1 provided in plurality (e.g., a plurality of first sensing electrodes SP1) arranged along a first direction (e.g., a x-direction), and a plurality of second sensing electrodes SP2 arranged along a second direction (e.g., a y-direction) which crosses the first direction. In an embodiment, for example, the first direction and the second direction may perpendicularly cross each other.

First sensing electrodes SP1 which are adjacent along the first direction may be electrically connected to each other through a first connection electrode CP1, and second sensing electrodes SP2 which are adjacent to each other along the second direction may be electrically connected to each other through a second connection electrode CP2.

The first sensing electrodes SP1 and the second sensing electrodes SP2 may include a conductive layer CTL (e.g., a conductive material layer). The conductive layer CTL may include a metal layer (e.g., metal material) or a transparent conductive layer (e.g., a transparent material). In an embodiment, for example, the metal layer may include molybdenum (Mo), mendelevium (Mb), silver (Ag), titanium (Ti), copper (Cu), aluminum (Al), or an alloy thereof. In an embodiment, for example, the transparent conductive layer may include a transparent conductive oxide such as indium tin oxide ("ITO"), indium zinc oxide ("IZO"), zinc oxide ("ZnO"), indium tin zinc oxide ("ITZO"), etc. In addition, the transparent conductive layer may include a conductive polymer such as poly(3,4-ethylene-dihydroxythiophene) ("PEDOT"), a metal nanowire, a carbon nanotube, graphene, etc.

The first connection electrodes CP1 and the second connection electrodes CP2 may include a conductive layer CTL, such as the metal layer or transparent conductive layer CTL described above. The first connection electrodes CP1 and the second connection electrodes CP2 may include or be formed of a same material as the first sensing electrodes SP1 and the second sensing electrodes SP2. That is, a connection electrode and a corresponding sensing electrode may be respective portions of a same material layer within the functional layer 400, without being limited thereto.

The first sensing electrodes SP1 and the second sensing electrodes SP2 may have a mesh structure including solid portions which define a plurality of openings. In an embodiment, for example, in FIG. 6A or 6B, a conductive layer CTL may be an element constituting the first sensing electrode SP1. The conductive layer CTL may represent the solid portion of a sensing electrode.

The conductive layer CTL includes body portions (e.g., solid portions) which define an opening CTL-OP provided in plurality (e.g., a plurality of openings CTL-OP). The body portions may at least partially surround the openings CTL-OP and define the respective openings CTL-OP. A connection structure of the body portions may form a mesh structure.

The second sensing electrode SP2, the first connection electrode CP1, and the second connection electrode CP2 may also have a mesh structure similar to the first sensing electrode SP1 shown in FIG. 6A or 6B.

As illustrated in FIG. 6A or 6B, each of the openings CTL-OP of the conductive layer CTL may overlap or correspond to a light-emitting area of a pixel P (e.g., the pixel P of FIG. 2). In an embodiment, for example, each of the openings CTL-OP may overlap one among a light emission area EA-R from which red light is emitted, a light emission area EA-G from which green light is emitted, or a light emission area EA-B from which blue light is emitted.

As illustrated in FIG. 6A, the openings CTL-OP may be entirely surrounded by the body portion of the conductive layer CTL and may not be spatially connected to other openings CTL-OP. The openings CTL-OP shown in FIG. 6A may be considered enclosed openings. On the other hand, as illustrated in FIG. 6B, in another embodiment, at least some of the openings CTL-OP may be partially surrounded by the body portion of the conductive layer CTL, and in this case, openings CTL-OP which neighbor each other may be spatially connected to each other.

The functional layer 400 may include an insulating layer 420 arranged above and/or below the conductive layer CTL, along a thickness direction of the display device 10. As illustrated in FIG. 6A or 6B, the insulating layer 420 may overlap or correspond to the conductive layer CTL. The insulating layer 420 may include an organic layer.

The insulating layer 420 may be common to more than one sensing electrode, without being limited thereto.

FIGS. 7 to 10 are respectively enlarged cross-sectional views of an embodiment of a pixel P of the display device 10 taken along line VII-VII' of FIG. 6A.

Referring to FIGS. 7 to 10, the display device 10 may include a pixel P provided in plural arranged on the substrate 100.

The substrate 100 may include a single layer including or formed of a glass material. Alternatively, the substrate 100 may include a polymer resin. The substrate 100 including the polymer resin may have a structure in which a layer including the polymer resin and an inorganic layer are stacked. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, etc.

A thin-film transistor TFT may include a semiconductor layer ACT including amorphous silicon, polycrystalline silicon or an organic semiconductor material, a gate electrode GE, a source electrode SE and a drain electrode DE. In order to secure insulation between the semiconductor layer ACT and the gate electrode GE, a gate insulating layer 203 may be between the semiconductor layer ACT and the gate electrode GE. The gate insulating layer 203 may include an inorganic material such as silicon oxide, silicon nitride and/or silicon oxynitride. In addition, an interlayer insulating layer 205 may be arranged on the gate electrode GE, and the source electrode SE and the drain electrode DE may be arranged on the interlayer insulating layer 205. The interlayer insulating layer 205 may include an inorganic material such as silicon oxide, silicon nitride and/or silicon oxynitride. The insulating layer including the inorganic material may be provided or formed by chemical vapor deposition ("CVD") or atomic layer deposition ("ALD").

The gate electrode GE, the source electrode SE and the drain electrode DE may include or be formed of various conductive materials. The gate electrode GE may include Mo or Al, and may have a multi-layer structure. In an embodiment, for example, the gate electrode GE may include a single layer including or formed of Mo, or may have a three-layer structure including a Mo layer, an Al layer, and a Mo layer. The source electrode SE and the drain electrode DE may include Ti or Al, and may have a multi-layer structure. In an embodiment, for example, the source electrode SE and the drain electrode DE may have a three-layer structure including a Ti layer, an Al layer, and a Ti layer.

A buffer layer 201 may be between the thin-film transistor TFT and the substrate 100. The buffer layer 201 may include an inorganic material such as silicon oxide, silicon nitride and/or silicon oxynitride. The buffer layer 201 may provide a flat upper surface, or may reduce or effectively prevent penetration of impurities from the substrate 100 into the semiconductor layer ACT of the thin-film transistor TFT.

A planarization insulating layer 207 may be arranged on the thin-film transistor TFT. The planarization insulating layer 207 may include or be formed of an organic material such as acryl, benzocyclobutene ("BCE"), or hexamethyldisiloxane ("HMDSO"). Though the planarization insulating layer 207 is illustrated as a single layer in FIG. 7, the planarization insulating layer 207 may be a multi-layer structure.

A pixel electrode 221 may be provided in plurality (e.g., pixel electrodes 221) arranged on the planarization insulating layer 207. The pixel electrode 221 may be positioned in or correspond to each one of a pixel P. In an embodiment, for example, pixel electrodes 221 respectively corresponding to pixels P which neighbor each other may be spaced apart from each other along the substrate 100.

The pixel electrode 221 may include a reflective electrode. In some embodiments, the pixel electrode 221 may include a reflective layer including or formed of Ag, magnesium (Mg), Al, platinum (Pt), palladium (Pd), gold (Au), nickel (Ni), neodymium (Nd), iridium (Ir), chromium (Cr), or a combination thereof, and a transparent or translucent electrode layer provided or formed on the reflective layer. The transparent or translucent electrode layer may include at least one of ITO, IZO, ZnO, indium oxide ($In_2O_3$), indium gallium oxide ("IGO") and aluminum zinc oxide ("AZO"). In some embodiments, the pixel electrode 221 may have a three-layer structure of an ITO layer, an Ag layer and an ITO layer.

A pixel-defining layer 209 may be located on the pixel electrode 221. The pixel-defining layer 209 may define a second opening 2090P corresponding to the pixel electrode 221, such as a central portion thereof. The pixel-defining layer 209 may reduce or effectively prevent electrical arcs or the like from being generated at edges of the pixel electrode 221, by covering the edges of the pixel electrode 221 and increasing a distance between the edges of the pixel electrode 221 and an opposite electrode 223. The pixel-defining layer 209 may include an organic insulating material such as polyimide, polyamide, acryl resin, benzocyclobutene, HMDSO, and phenol resin, and may be provided or formed by using spin coating, etc. Alternatively, the pixel-defining layer 209 may include or be formed of an inorganic insulating material. Alternatively, the pixel-defining layer 209 may have a multi-layer structure including an inorganic insulating material and an organic insulating material.

Though not shown, a spacer may be further provided or formed on the pixel-defining layer 209. In an exemplary embodiment, for example, the spacer may reduce or effectively prevent damage to layers between the substrate 100 and the spacer from by a mask used in a process of providing or forming an emission layer 222b. The spacer may include a same material as the pixel-defining layer 209, or the spacer and the pixel-defining layer 209 may be respective portions of a same material layer on the substrate 100.

The emission layer 222b may be arranged in the second opening 2090P of the pixel-defining layer 209. The emission layer 222b may include an organic material. The organic material may include a fluorescent or phosphorescent material with which red, green, or blue light is generated and/or emitted. The organic material described above may include a relatively low molecular weight organic material or a polymer organic material.

A first functional layer 222a and a second functional layer 222c may be respectively arranged below and above the emission layer 222b. The first functional layer 222a may include, for example, a hole transport layer ("HTL") or a hole injection layer ("HIL"). The second functional layer 222c is arranged on the emission layer 222b and may include an electron transport layer ("ETL") and/or an electron injection layer ("EIL"). The second functional layer 222c may be an optional element, and for example, in some embodiments, the second functional layer 222c may be omitted.

The emission layer 222b is arranged in each pixel P to correspond to the second opening 2090P of the pixel-defining layer 209, whereas the first functional layer 222a and the second functional layer 222c may be integrally provided or formed to entirely cover the substrate 100, like the opposite electrode 223 to be described below. That is, the first functional layer 222a and the second functional layer 222c may extend along the substrate 100 to be common to each of a plurality of pixels P.

The opposite electrode 223 may include a (semi)transparent layer including Ag, Mg, Al, Pt, Pd, Au, Ni, Nd, Ir, Cr, lithium (Li), calcium (Ca), or an alloy thereof. Alternatively, the opposite electrode 223 may further include a layer such as ITO, IZO, ZnO, or $In_2O_3$ on the (semi)transparent layer including the material described above. According to an embodiment, the opposite electrode 223 may include Ag, Mg, or an alloy of Ag and Mg.

The encapsulation layer 300 may include at least one inorganic encapsulation layer and an optical layer. In an embodiment, for example, the encapsulation layer 300 may include a first inorganic encapsulation layer 310 (e.g., a first inorganic layer) and a second inorganic encapsulation layer 330 (e.g., a second inorganic layer) facing each other, and may include an optical layer therebetween. The encapsulation layer 300 may be arranged on a display element OLED to cover the display element OLED.

The optical layer may include a first organic layer defining a first opening corresponding to the emission layer 222b, and a first refractive layer which is on the first organic layer. The first refractive layer may have a refractive index greater than a refractive index of the first organic layer. The first refractive layer may be arranged on the first organic layer to fill the first opening of the first organic layer. The first organic layer and the first refractive layer together form a first optical layer within the display device 10.

Figure 7:
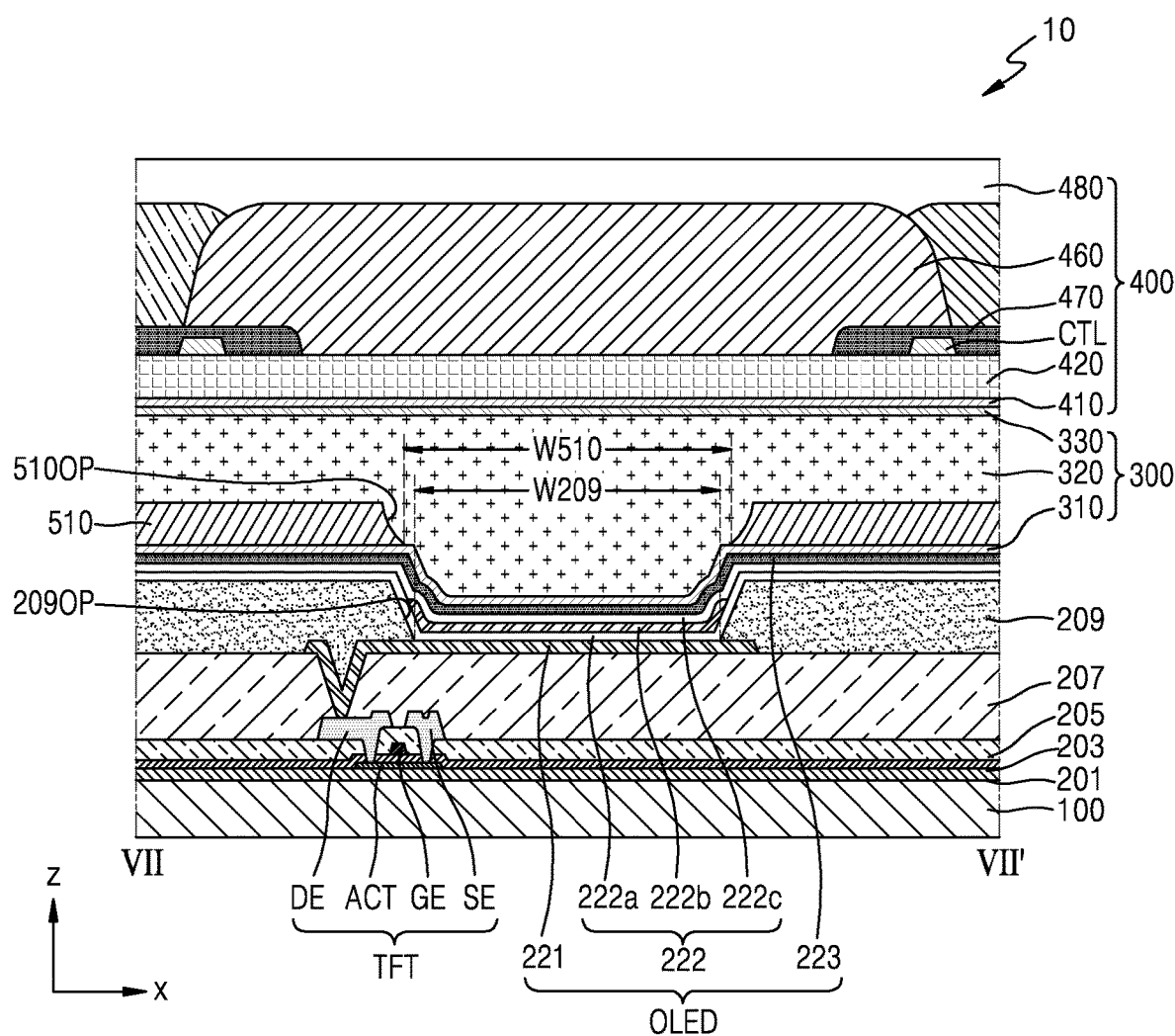
FIGS. 7 to 10 are respectively enlarged cross-sectional views of an embodiment of a pixel of a display device.
Figure 8:
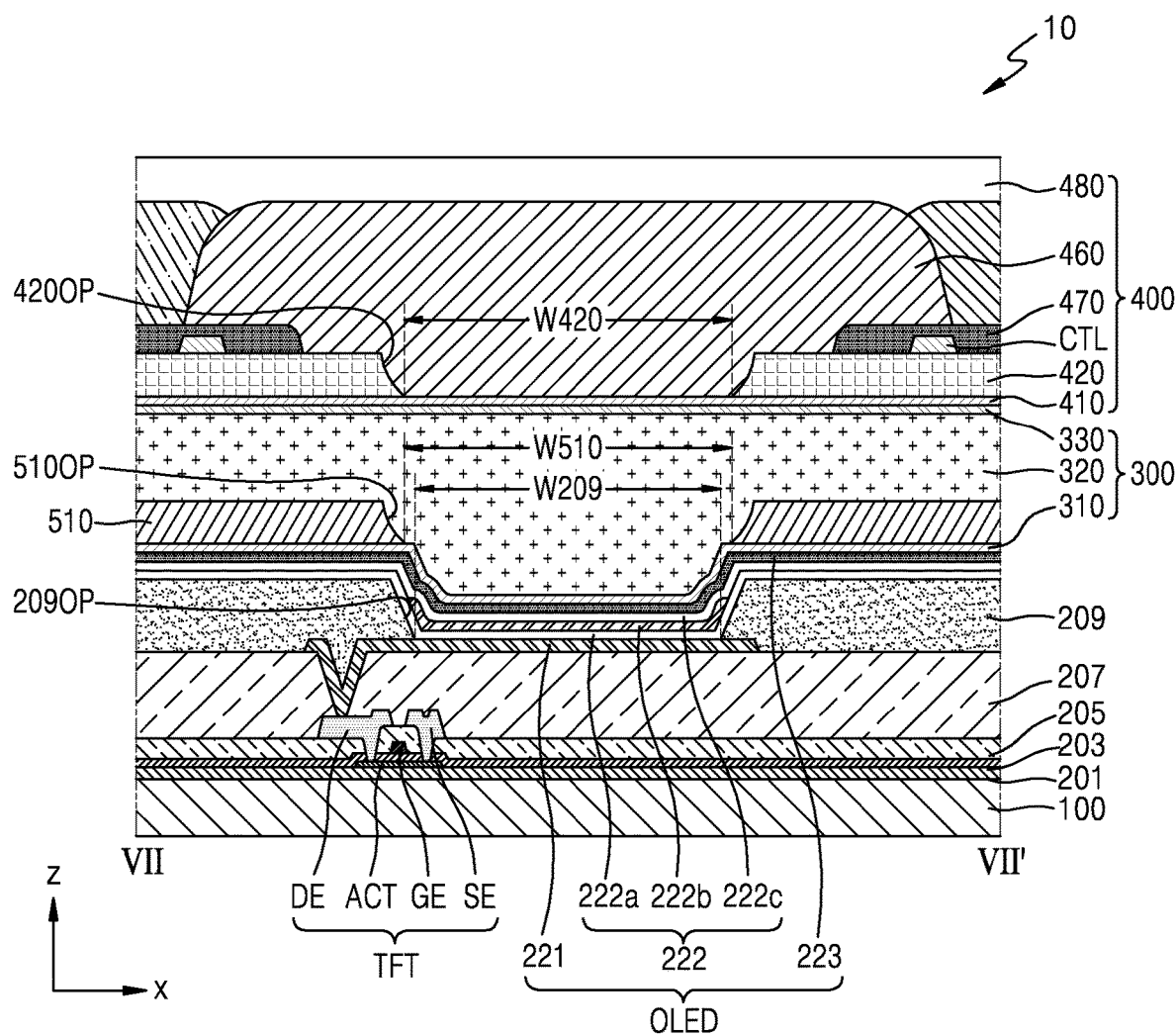

Referring to FIGS. 7 and 8, light emitted from the display element OLED travels in a light-emitting direction (e.g., z-direction). Within the optical layer, a refractive layer follows the organic layer in the light-emitting direction. That is, the organic layer is closer to the display element OLED than the refractive layer, while the refractive layer is further from the display element OLED than the optical layer.

Figure 9:
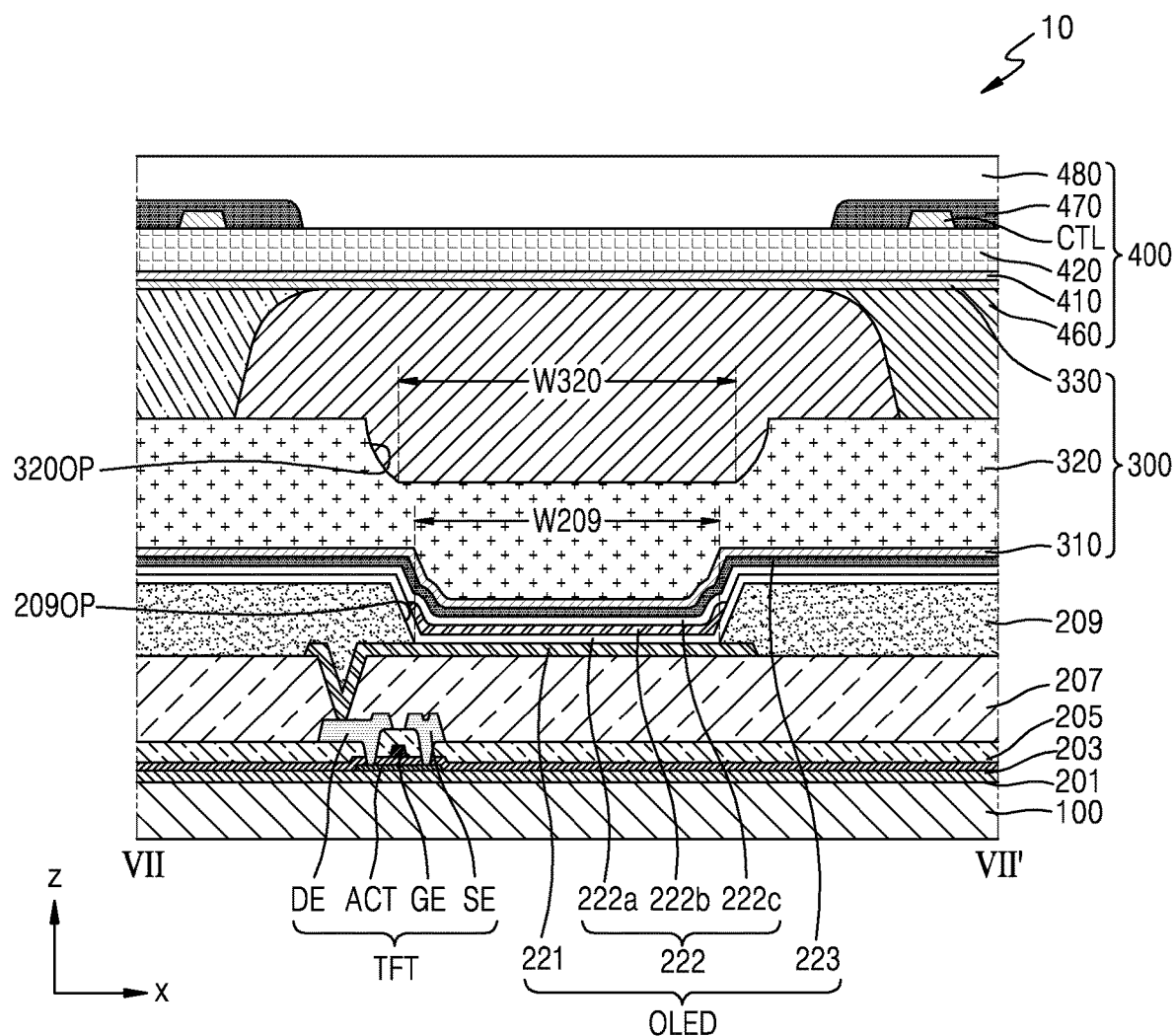
Figure 10:
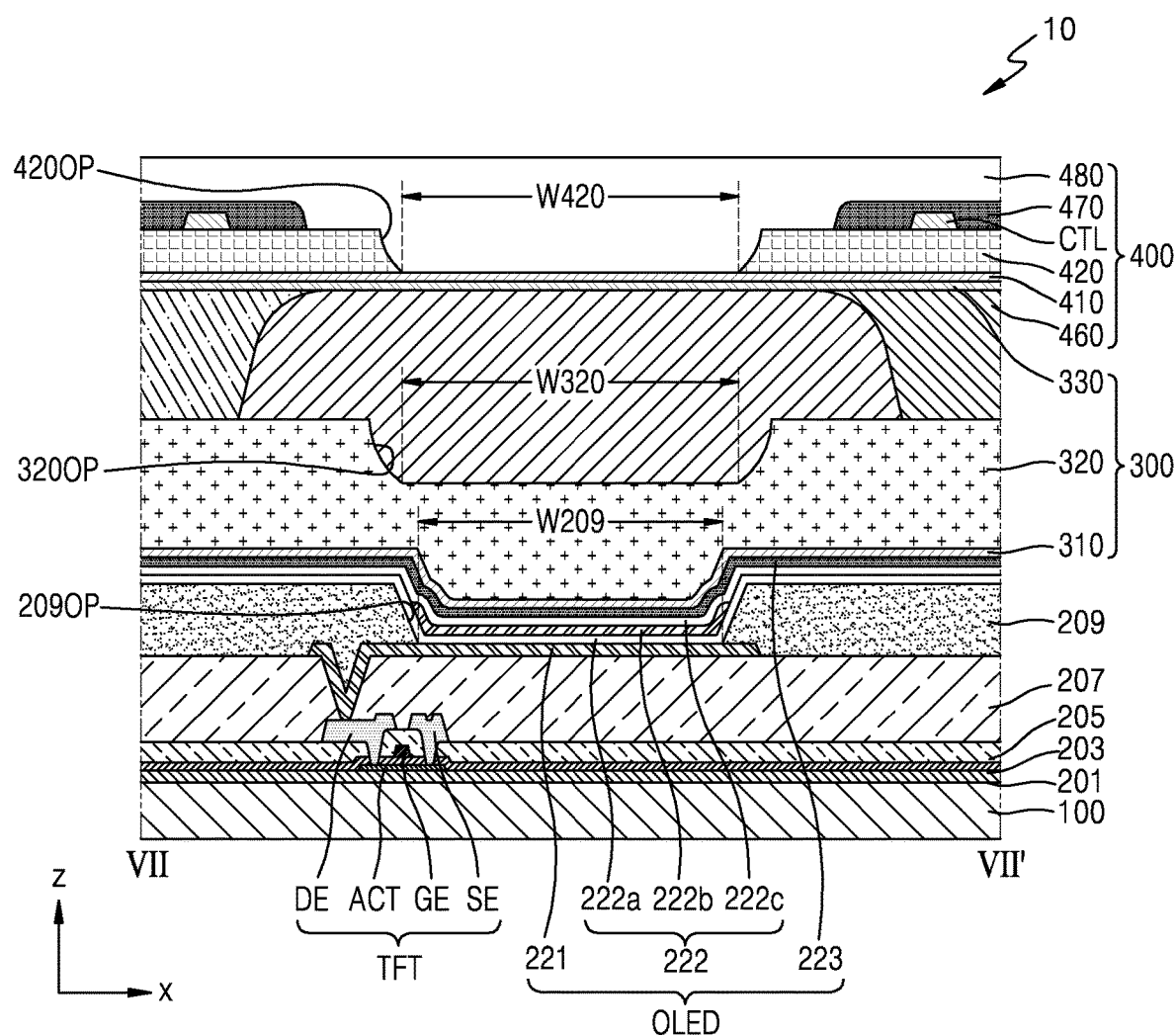

In this regard, FIGS. 7 and 8 illustrate a structure in which an embodiment of an optical layer between the first inorganic encapsulation layer 310 and the second inorganic encapsulation layer 330 includes an organic film layer 510 as a first organic layer, and an organic encapsulation layer 320 as a first refractive layer. The optical layer may otherwise be referred to as an organic layer or an organic material layer. FIGS. 9 and 10 illustrate a structure in which an embodiment of an optical layer between the first inorganic encapsulation layer 310 and the second inorganic encapsulation layer 330 includes an organic encapsulation layer 320 as a first organic layer and a color filter layer 460 (or color filter pattern) as a first refractive layer.

The first inorganic encapsulation layer 310 and the second inorganic encapsulation layer 330 may include at least one inorganic insulating material among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may have a single layer structure or a multi-layer structure including the inorganic insulating material described above.

Referring to FIGS. 7 and 8, an embodiment of an encapsulation layer 300 may include the organic film layer 510 and the organic encapsulation layer 320 both between the first inorganic encapsulation layer 310 and the second inorganic encapsulation layer 330. That is, the first inorganic encapsulation layer 310 and the second inorganic encapsulation layer 330 face each other with both the organic film layer 510 and the organic encapsulation layer 320 therebetween.

The organic film layer 510 may define a first opening 510OP at a position corresponding to the emission layer 222b. The organic film layer 510 may include a light-transmissive material or an organic material. The organic material may include at least one of acryl, polyimide, polyamide, and tris(8-hydroxyquinolinato)aluminum ($Alq_3$).

The organic film layer 510 may include photoresist material. A first opening 510OP recessed from an upper surface of the organic film layer 510 may be provided or formed by patterning the organic film layer 510 include photoresist material such as through a photolithography process.

The organic film layer 510 may include a side surface that is inclined with respect to an upper surface of the first inorganic encapsulation layer 310. The side surface of the organic film layer 510 defines the first opening 510OP. The side surface of the organic film layer 510 at the first opening 510OP may include an inclined surface that is tapered in a forward direction with respect to the upper surface of the first inorganic encapsulation layer 310. In an embodiment, a minor angle ($\theta$) (hereinafter, referred to as an inclination angle) between the upper surface of the first inorganic encapsulation layer 310 and the side surface of the organic film layer 510 may be greater than or equal to about 70 degrees. In an embodiment, for example, the inclination angle ($\theta$) in degrees may be about $70 \leq \theta < 90$. Alternatively, the inclination angle ($\theta$) in degrees may be about $70 \leq \theta \leq 87$, about $70 \leq \theta \leq 85$, about $70 \leq \theta \leq 83$, or about $70 \leq \theta \leq 80$.

In an embodiment, the side surface of the organic film layer 510 may be concave to define a concave surface (e.g., a concave recess). The concave surface may define a portion of an upper surface of the organic film layer 510 which includes a concavely round portion. A volume or portion of the first opening 510OP may overlap the organic film layer 510 at the concave surface thereof.

As illustrated in FIGS. 7 and 8, the first opening 510OP may be provided or formed to penetrate a thickness of the organic film layer 510. The first opening 510OP may be open at both the lower and upper surfaces of the organic film layer 510. In this case, a width of the first opening 510OP of the organic film layer 510 at an upper surface thereof, may be less than a width W510 of the first opening 510OP.

A width W510 of the first opening 510OP may be greater than or equal to a width W209 of the second opening 2090P in the pixel-defining layer 209. The width W510 of the first opening 510OP may be defined as a distance between facing side surfaces of the organic film layer 510 at the first opening 510OP, taken at the lower surface of the organic film layer 510. In addition, the width W209 of the second opening 2090P may correspond to a distance between facing side surfaces of the pixel-defining layer 209 at the second opening 2090P, taken at a lower surface of pixel-defining layer 209. The width W209 may correspond to or define a width of a light emission area in which light is emitted from a pixel P. As used herein, a width of an opening in a layer may be a minimum distance between facing side surfaces of the layer at such opening thereof, without being limited thereto.

Though not shown, in another embodiment, the organic film layer 510 may not extend through the lower surface of the organic film layer 510 unlike the first opening 510OP penetrating both the lower and upper surfaces of the organic film layer 510 shown in FIG. 7.

The organic encapsulation layer 320 may be arranged on the organic film layer 510 to fill the first opening 510OP. The organic encapsulation layer 320 may have a refractive index greater than a refractive index of the organic film layer 510. In an embodiment, for example, the refractive index of the organic film layer 510 may be about 1.3 to about 1.6, and the refractive index of the organic encapsulation layer 320 may be about 1.7 to about 1.9. That is, along a light-emitting direction within the optical layer, the layer having the higher refractive index is further from the display element OLED than the layer having the lower refractive index.

The organic encapsulation layer 320 may include a polymer-based material (e.g., include a polymer). The polymer-based material may include polyethylene terephthalate, polyethylene naphthalate, polycarbonate, polyimide, polyethylene sulfonate, polyoxymethylene, polyarylate, hexamethyldisiloxane, an acrylic resin (e.g., polymethyl methacrylate, polyacrylic acid, etc.), or any combination thereof. The organic encapsulation layer 320 may alleviate internal stress of the first inorganic encapsulation layer 310 and/or the second inorganic encapsulation layer 330.

The organic encapsulation layer 320 may include a light-transmissive material or an organic material having relatively high refractive characteristics. In an embodiment, for example, the organic material may include at least one of PEDOT, 4,4'-bis[N-(3-methylphenyl)-N-phenylamino]biphenyl ("TPD"), 4,4',4"-tris[(3-methylphenyl)phenylamino] triphenylamine (m-MTDATA), 1,3,5-tris[N, N-bis(2-methylphenyl)-amino]-benzene (o-MTDAB), 1,3,5-tris[N, N-bis (3-methylphenyl)-amino]-benzene (m-MTDAB), 1,3,5-tris [N, N-bis(4-methylphenyl)-amino]-benzene (p-MTDAB), 4,4'-bis[N, N-bis(3-methylphenyl)-amino]-diphenylmethane ("BPPM"), 4,4'-dicarbazolyl-1,1'-biphenyl ("CBP"), 4,4',4"-tris(N-carbazole)triphenylamine ("TCTA"), 2,2',2"-(1,3,5-benzentolyl)tris-[1-phenyl-1H-benzoimidazole] ("TPBI"), and 3-(4-biphenyl)-4-phenyl-5-t-butylphenyl-1,2, 4-triazole ("TAZ").

In FIGS. 7 and 8, the organic film layer 510 and the organic encapsulation layer 320, which together constitute the optical layer, may perform a function of concentrating light emitted from the emission layer 222b (e.g., incident to the optical layer) such that concentrated light is emitted along a z-direction by changing a path of incident light which travels in a lateral direction (e.g., a direction other than the z-direction) among the light emitted from the emission layer 222b.

Referring to FIGS. 9 and 10, an encapsulation layer 300 according to another embodiment may include an organic encapsulation layer 320 and a color filter layer 460 as an optical layer between the first inorganic encapsulation layer 310 and the second inorganic encapsulation layer 330. A color filter pattern 460 may be provided in plurality in a same layer on the substrate 100, to define a color filter layer 460.

The organic encapsulation layer 320 may define a fourth opening 320OP of the organic encapsulation layer 320 at a position corresponding to the emission layer 222b. The organic encapsulation layer 320 may include a light-transmissive material or an organic material, and the organic material may include at least one of acryl, polyimide, polyamide, and Alq$_3$.

The organic encapsulation layer 320 may include photoresist material. The fourth opening 320OP of the organic encapsulation layer 320 may be provided or formed through a photolithography process.

In an embodiment, for example, the organic encapsulation layer 320 may include the fourth opening 320OP recessed from an upper surface thereof, and defining an inclined side surface that is tapered in a forward direction. A volume or a portion of the fourth opening 320OP of the organic encapsulation layer 320 may overlap the inclined side surface of the organic encapsulation layer 320.

As another example, the organic encapsulation layer 320 may include a concave side surface having a concavely round portion which is recessed from an upper surface of the organic encapsulation layer 320. A volume or portion of the fourth opening 320OP of the organic encapsulation layer 320 may overlap the concave side surface of the organic encapsulation layer 320.

As illustrated in FIGS. 9 and 10, the fourth opening 320OP of the organic encapsulation layer 320 which is open at an upper surface of the organic encapsulation layer 320, may not penetrate through a lower surface of the organic encapsulation layer 320.

In an embodiment, for example, a width W320 of the fourth opening 320OP of the organic encapsulation layer 320 defined at the lower surface of the organic encapsulation layer 320 may be greater than or equal to the width W209 of the second opening 209OP of the pixel-defining layer 209. That is, the width W320 of the fourth opening 320OP of the organic encapsulation layer 320 may be greater than or equal to the width of the light emission area.

In FIGS. 9 and 10, the color filter layer 460 may be arranged on the organic encapsulation layer 320. The color filter layer 460 may fill the fourth opening 320OP of the organic encapsulation layer 320 and cover the organic encapsulation layer 320.

The color filter layer 460 as the first refractive layer may have a refractive index greater than a refractive index of the organic encapsulation layer 320 as the first organic layer of the optical layer between the first inorganic encapsulation layer 310 and the second inorganic encapsulation layer 330. In an embodiment, for example, the refractive index of the organic encapsulation layer 320 may be about 1.3 to about 1.6, and the refractive index of the color filter layer 460 may be about 1.7 to about 1.9.

The color filter layer 460 may include a color filter (or color filter pattern) corresponding to a wavelength band of light emitted through the emission layer 222b. In an embodiment, for example, when a color of the light emitted from the emission layer 222b is red, the color filter layer 460 covering the fourth opening 320OP of the organic encapsulation layer 320 which corresponds to the emission layer 222b, may include a red color filter.

The color filter layer 460 may not only concentrate light in a forward z-direction, but may also improve the definition of light which is emitted from the display device 10 to outside thereof.

The color filter layer 460 may include, for example, at least one of PEDOT, TPD, m-MTDATA, o-MTDAB, m-MTDAB, p-MTDAB, BPPM, CBP, TCTA, TPBI, and TAZ.

Referring back to FIGS. 7 through 10, a functional layer 400 may be further arranged on the encapsulation layer 300.

The functional layer 400 may include a conductive layer CTL including sensing electrodes, and an input sensing layer including an insulating layer 420 which is arranged above or below the conductive layer CTL. The input sensing layer may obtain coordinate information according to an external input, for example, a touch event. The input sensing layer may sense an external input in a mutual capacitance mode or a self-capacitance mode.

Though a structure in which the conductive layer CTL is arranged on the insulating layer 420 is illustrated in FIGS. 7 through 10, the conductive layer CTL may also be arranged under the insulating layer 420. In an embodiment, for example, the conductive layer CTL under the insulating layer 420 may be electrically connected to the conductive layer CTL through a contact hole defined in the insulating layer 420.

A base layer 410 may be between the conductive layer CTL and the encapsulation layer 300. The base layer 410 may include an inorganic insulating layer such as silicon nitride. In another embodiment, the base layer 410 may be omitted and the conductive layer CTL may be directly on the encapsulation layer 300. In addition, in another embodiment, the base layer 410 may include an organic insulating layer.

A light-shielding layer 470 may be arranged on the input sensing layer including both the conductive layer CTL and the insulating layer 420. As illustrated in FIGS. 7 to 10, the light-shielding layer 470 may be arranged to cover at least a portion of the conductive layer CTL to correspond to a position where the conductive layer CTL, for example, the sensing electrodes, are located.

The light-shielding layer 470 may include a black pigment, and may reduce or effectively prevent deterioration of display quality due to external light, by at least partially absorbing external light or internal reflected light. Since the display device 10 includes the light-shielding layer 470 and/or the color filter layer 460, a polarizing plate may be omitted. Accordingly, the manufacturing cost may be reduced, or the total thickness of the display device 10 may be reduced.

Referring to FIGS. 7 and 8, the display device 10 may further include a color filter layer 460 on the light-shielding layer 470. That is, the color filter layer 460 may face the encapsulation layer 300 with the light-shielding layer 470 therebetween.

The color filter layer 460 may include a color filter corresponding to each one of an emission layer 222b. In an embodiment, for example, the emission layer 222b may emit one of blue, green, or red light, and the color filter layer 460 may include a blue, green, or red color filter according to a color of light emitted from an emission layer 222b of each pixel P. In an embodiment, for example, when a color of light emitted from an emission layer 222b is red, a color filter corresponding to the emission layer 222b may be a red color filter having high transmittance in a red light wavelength band.

As illustrated in FIGS. 9 and 10, when the color filter layer 460 is provided on the encapsulation layer 300, a color filter layer 460 may be omitted on the light-shielding layer 470. That is, the light-shielding layer 470 may face the substrate 100 with the color filter layer 460 therebetween.

Referring back to FIGS. 7 to 10, a planarization layer 480 may be arranged on the light-shielding layer 470. As in the embodiments described with reference to FIGS. 7 and 8, when the color filter layer 460 is arranged on the light-shielding layer 470, the planarization layer 480 may be arranged on the color filter layer 460 to cover the color filter layer 460.

The planarization layer 480 may have a substantially flat top surface and may include an organic material such as acryl, BCB, or HMDSO.

Referring to FIGS. 8 and 10, a second optical layer including a second organic layer having a third opening 420OP corresponding to the emission layer 222b and a second refractive layer on the second organic layer, may be arranged on the encapsulation layer 300. The second refractive layer may have a refractive index greater than that of the second organic layer and may be located on the second organic layer to fill the third opening 420OP of the second organic layer.

In an embodiment of a second optical layer, for example, in FIG. 8, the insulating layer 420 may be provided as the second organic layer, and the color filter layer 460 may be provided as the second refractive layer. In an embodiment of a second optical layer, for example, in FIG. 10, the insulating layer 420 may be provided as the second organic layer, and the planarization layer 480 may be provided as the second refractive layer.

The third opening 420OP may be provided or formed at a position corresponding to a position where the emission layer 222b is arranged, and a width W420 of the third opening 420OP may be greater than or equal to the width W209 of the second opening 209OP of the pixel-defining layer 209.

The width W420 of the third opening 420OP may be greater than or equal to the width W510 of the first opening 510OP of the organic film layer 510 illustrated in FIG. 8 as a first organic layer of a first optical layer described above. In addition, the width W420 of the third opening 420OP may be greater than or equal to the width W320 of the fourth opening 320OP of the organic encapsulation layer 320 illustrated in FIG. 10 as the first organic layer of a first optical layer described above.

The third opening 420OP may be provided or formed through a photolithography process, and a shape in a top plan view (e.g., planar shape) of the third opening 420OP may be substantially similar to a shape in a top plan view (e.g., planar shape) of the first opening 510OP or the fourth opening 320OP of the organic encapsulation layer 320.

Within the second optical layer, the second refractive layer, for example, the color filter layer 460 of FIG. 8 or the planarization layer 480 of FIG. 10, may have a refractive index of about 1.7 to about 1.9. Within the second optical layer, the second organic layer under the second refractive layer, for example, the insulating layer 420 in FIG. 8 and FIG. 10, may have a refractive index of about 1.3 to about 1.6.

In the embodiments of FIGS. 8 and 10, the display device 10 includes two or more optical layers arranged in a light-emitting direction from the display element OLED, thereby further increasing efficiency of light extraction from a front side of the display device 10 (e.g., viewing side or in the light-emitting direction) and enhancing visibility of the front side of the display device 10.

According to one or more embodiments, a display device 10 with improved light emission efficiency may be provided, and in particular, a display device 10 may be provided having a reduced total thickness or at reduced manufacturing, costs by simplifying a manufacturing process of the display device 10.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:
1. A display device comprising:
   a display area at which an image is displayed;
   a display element which is in the display area and emits light in a light-emitting direction, the display element comprising a pixel electrode, an opposite electrode, and a light emission layer between the pixel electrode and the opposite electrode;

an encapsulation layer covering the display element;

sensing electrodes which sense an external input, the sensing electrodes disposed on the encapsulation layer; and a light-shielding layer disposed on each of the sensing electrodes to correspond to each of the sensing electrodes, wherein the encapsulation layer comprises:
- a first organic layer having a refractive index,
- a first opening defined in the first organic layer and corresponding to the light emission layer of the display element, and
- a first refractive layer covering the first organic layer and further from the display element than the first organic layer, along the light-emitting direction.

2. The display device of claim 1, wherein the encapsulation layer further comprises a first inorganic encapsulation layer and a second inorganic encapsulation layer which is further from the display element than the first inorganic encapsulation layer, and within the encapsulation layer, the first inorganic encapsulation layer and the second inorganic encapsulation layer face each other with both the first organic layer and the first refractive layer therebetween.

3. The display device of claim 2, wherein within the encapsulation layer, the first inorganic encapsulation layer comprises a lower surface and an upper surface which is further from the display element than the lower surface, and the first organic layer comprises a side surface at the first opening, which is inclined with respect to the upper surface of the first inorganic encapsulation layer.

4. The display device of claim 1, wherein within the encapsulation layer, the first refractive layer comprises an organic encapsulation layer which fills the first opening defined in the first organic layer.

5. The display device of claim 1, further comprising:

a color filter facing the encapsulation layer with the light-shielding layer therebetween, and a wavelength band of the light which is emitted from the light emission layer of the display element, wherein the color filter corresponds to the wavelength band of the light emitted from the light emission layer of the display element.

6. The display device of claim 1, further comprising:

a wavelength band of the light which is emitted from the light emission layer of the display element, and a color filter corresponding to the wavelength band of the light emitted from the light emission layer of the display element, wherein within the encapsulation layer, the first refractive layer comprises the color filter corresponding to the wavelength band of the light emitted from the light emission layer of the display element.

7. The display device of claim 1, wherein the light-shielding layer comprises a black pigment.

8. The display device of claim 1, further comprising:

a pixel-defining layer covering edges of the pixel electrode of the display element, and a second opening defined in the pixel-defining layer and corresponding to the pixel electrode of the display element, wherein the second opening has a width and the first opening has a width which is greater than or equal to the width of the second opening.

9. The display device of claim 1, wherein within the encapsulation layer, the first organic layer comprises a lower surface and an upper surface which is further from the display element than the lower surface, and the first opening penetrates through both the lower surface and the upper surface of the first organic layer.

10. The display device of claim 1, wherein the first refractive layer has a refractive index greater than the refractive index of the first organic layer.

11. The display device of claim 10, wherein within the encapsulation layer, the refractive index of the first refractive layer is about 1.7 to about 1.9.

12. The display device of claim 1, wherein the first organic layer, the first opening and the first refractive layer together define a first optical layer, further comprising a second optical layer facing the display element with the first optical layer therebetween, the second optical layer comprising:
- a second organic layer having a refractive index,
- a third opening defined in the second organic layer and corresponding to the light emission layer of the display element; and
- a second refractive layer covering the light-shielding layer and the second organic layer.

13. The display device of claim 12, wherein the display element emits the light in the light-emitting direction, and within the second optical layer, the second refractive layer is further from the display element than the second organic layer, along the light-emitting direction.

14. The display device of claim 12, wherein within the second optical layer, the second refractive layer comprises a color filter.

15. The display device of claim 12, wherein the first opening of the first optical layer has a width and the third opening of the second optical layer has a width which is greater than or equal to the width of the first opening.

16. The display device of claim 12, wherein within the second optical layer, the second organic layer comprises photoresist material.

17. The display device of claim 12, wherein the second refractive layer has a refractive index greater than the refractive index of the second organic layer.

18. A display device comprising:

a display area in which an image is displayed;

a display element which is in the display area and emits light in a light-emitting direction, the display element comprising a pixel electrode, an opposite electrode, and a light emission layer between the pixel electrode and the opposite electrode;

an encapsulation layer covering the display element;

an input sensing layer facing the display element with the encapsulation layer therebetween; and an optical layer which is between the display element and the input sensing layer, wherein the optical layer which is between the display element and the input sensing layer comprises:
- an organic layer having a refractive index,
- a concave recess which is open in a direction toward the input sensing layer and corresponds to the light emission layer of the display element; and a refractive layer covering the organic layer and further from the display element than the organic layer, along the light-emitting direction.

19. The display device of claim 18, further comprising:
a wavelength band of the light which is emitted from the light emission layer of the display element, and
a color filter corresponding to the wavelength band of the light emitted from the light emission layer of the display element,
wherein within the optical layer which is between the display element and the input sensing layer, the refractive layer comprises the color filter.

* * * * *